United States Patent [19]

Tsumura et al.

[11] Patent Number: 5,500,537

[45] Date of Patent: Mar. 19, 1996

[54] FIELD-EFFECT TRANSISTOR WITH AT LEAST TWO DIFFERENT SEMICONDUCTIVE ORGANIC CHANNEL COMPOUNDS

[75] Inventors: Akira Tsumura; Hiroyuki Fuchigami; Hideharu Nobutoki; Hiroshi Koezuka, all of Amagasaki, Japan

[73] Assignee: Mitsubishi Denki Kabushiki Kaisha, Tokyo, Japan

[21] Appl. No.: 372,219

[22] Filed: Jul. 30, 1993

Related U.S. Application Data

[63] Continuation of Ser. No. 785,163, Oct. 31, 1991, abandoned, which is a continuation of Ser. No. 562,561, Aug. 3, 1990, abandoned.

[30] Foreign Application Priority Data

| Aug. 17, 1989 | [JP] | Japan | 1-211739 |
| Aug. 17, 1989 | [JP] | Japan | 1-211740 |
| Jan. 29, 1990 | [JP] | Japan | 2-19464 |
| Jun. 19, 1990 | [JP] | Japan | 2-160629 |

[51] Int. Cl.$^6$ .................... H01L 35/24; H01L 51/00
[52] U.S. Cl. ............... 257/40; 257/20; 257/24; 257/191; 257/192
[58] Field of Search ............ 357/8, 16; 350/334; 257/40, 20, 24, 191, 192

[56] References Cited

U.S. PATENT DOCUMENTS

| 3,775,177 | 11/1973 | Hayama et al. | 357/8 |
| 3,789,216 | 1/1974 | Komp | 357/8 |
| 4,175,982 | 11/1979 | Loutfy et al. | 357/8 |
| 4,269,738 | 5/1981 | Pez et al. | 357/8 |
| 4,855,806 | 8/1989 | Parks et al. | 359/59 |
| 4,873,556 | 10/1989 | Hyodo et al. | 357/16 |
| 4,885,211 | 12/1989 | Tang et al. | 357/8 |
| 4,902,555 | 2/1990 | Isoda et al. | 357/8 |
| 4,994,204 | 2/1991 | Doane et al. | 350/334 |

FOREIGN PATENT DOCUMENTS

| 0316230A1 | 5/1989 | European Pat. Off. | 357/8 |
| 0316230 | 5/1989 | European Pat. Off. | 357/8 |
| 2510821 | 9/1975 | Germany | 357/8 |
| 62-31175 | 2/1987 | Japan | 357/8 |
| 31175 | 2/1987 | Japan | 357/8 |
| 62-222670 | 9/1987 | Japan | 357/8 |
| 63-14472 | 1/1988 | Japan | 357/8 |
| 63-70567 | 3/1988 | Japan | 357/8 |

OTHER PUBLICATIONS

"Polythiophene Field–Effect Transistor: Its Characteristics and Operation Mechanism" by A. Tsumura, et al—Synthetic Metals, 25 (1988) pp. 11–23.

"A Well–Behaved Field Effect Transistor Based On An Intrinsic Molecular Semiconductor" by R. Madru, et al—Chemical Physics Letters, vol. 145, No. 4, Apr. 8, 1988, pp. 343–346.

"Field–Effect Transistor Utilizing Conducting Polymers" by H. Koezuka, et al Synthetic Metals, 28 (1989) pp. C753–C–760.

Primary Examiner—Sara W. Crane
Assistant Examiner—Alice W. Tang
Attorney, Agent, or Firm—Oblon, Spivak, McClelland, Maier & Neustadt

[57] ABSTRACT

A field effect transistor has a channel between a source electrode and a drain electrode made from an organic semiconductor. In one form of the invention, the channel is a mixture of at least two different organic compounds. In another form of the invention, the channel is a lamination of at least two films of different organic compounds. The channel can also be a π-conjugated block copolymer of at least two different types of monomers.

14 Claims, 3 Drawing Sheets

F I G. 1
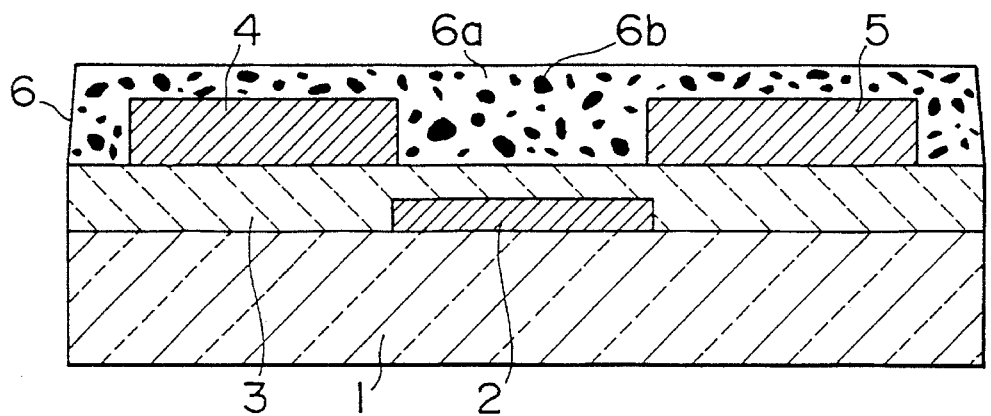
F I G. 2
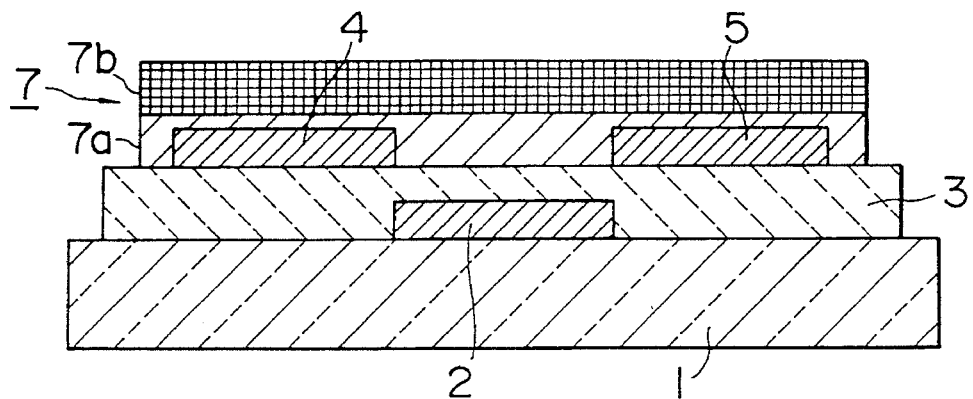
F I G. 3
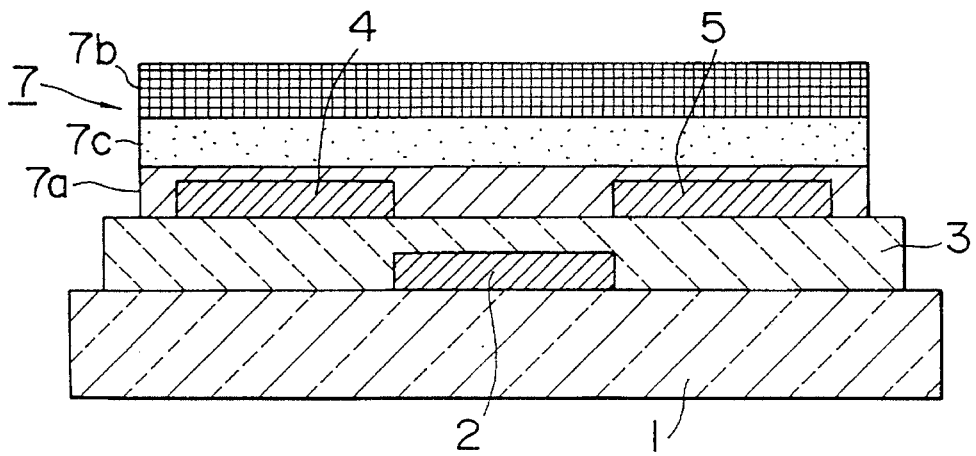

FIELD-EFFECT TRANSISTOR WITH AT LEAST TWO DIFFERENT SEMICONDUCTIVE ORGANIC CHANNEL COMPOUNDS

This application is a continuation of application Ser. No. 07/785,163, filed on Oct. 31, 1991, now abandoned, which is an FWC of application Ser. No. 07/562,561, filed on Aug. 3, 1990, now abandoned.

BACKGROUND OF THE INVENTION

This invention relates to a field effect transistor (herebelow referred to as a FET) employing an organic compound as a semiconductor.

Conventional FET's employ inorganic semiconductors such as monocrystal silicon or GaAs. However, FET's using inorganic semiconductors are disadvantageous in that they are expensive and in many cases are complicated to manufacture. Furthermore, there are limitations on the size of an inorganic semiconductor device.

FET's are frequently used as active drive elements for large area liquid crystal displays. At present, such FET's are typically thin film transistors using amorphous silicon formed by CVD (chemical vapor deposition). As the area of the display increases, it becomes difficult and expensive to manufacture a large number of uniform inorganic FET's on a single substrate. Therefore, attempts have recently been made to manufacture a FET using an organic semiconductor. Of organic semiconductors, those comprising a π-conjugated polymer have excellent semiconductor properties. Moreover, π-conjugated polymers have the excellent formability which is characteristic of polymers, so they can be readily formed into semiconductor layers having a large area. This has made them particularly attractive for use in FET's.

Various π-conjugated polymers have been used as semiconductors in FET's, including polyacetylene (see Journal of Applied Physics, Vol. 54, p. 3255 (1985)), poly(N-methylpyrrole) (see Chemistry Letters, p. 863 (1986)), polythiophene (see Applied Physics Letters, Vol. 49, pp. 1210–1212 (1986)), and poly(3-hexylthiophene) (see Applied Physics Letters, Vol. 53, p. 195 (1988)). However, none of these materials has been found completely satisfactory for practical applications. In a FET employing polyacetylene as a semiconductor, the source-drain current which can be generated in response to the application of a gate voltage is extremely small. A FET element using polythiophene as a semiconductor has a much higher source-drain current which can be modulated by 100–1000 times by controlling the gate voltage. However, the ON/OFF ratio and the source-drain current of a FET employing polythiophene as a semiconductor are still relatively low compared to those of a FET employing an inorganic semiconductor. Furthermore, as polythiophene is normally formed by electrochemical polymerization, it is difficult to simultaneously form a large number of uniform FET's using polythiophene. Although poly(3-hexylthiophene) has the advantage that it is soluble in various solvents, a FET employing it as a semiconductor does not have properties, such as source-drain current and ON/OFF ratio, as good as those of a FET employing polythiophene. Poly(N-methylpyrrole) is also not completely satisfactory as an organic semiconductor for a FET.

Thus, a conventional FET using an organic semiconductor has the problem that the magnitude of the source-drain current and the extent to which it can be modulated by a gate voltage are low.

It is possible to increase the source-drain current of a FET using a π-conjugated polymer as a semiconductor by doping the π-conjugated polymer. However, as doping increases the electrical conductivity of the entire semiconductor channel, the source-drain current of the resulting FET increases when no gate voltage is applied (the leak current). As a result, the modulation width of the source-drain current in response to a gate voltage is small, and the properties such as source-drain current and ON/OFF ration, of the FET are poor.

SUMMARY OF THE INVENTION

Accordingly, it is an object of the present invention to provide a FET which employs an organic semiconductor as a channel and has both a high source-drain current when the FET is on and a low leak current when the FET is off.

It is another object of the present invention to provide a FET employing an organic semiconductor as a channel which can be easily formed over large areas.

It is a further object of the present invention to provide a liquid crystal display having a drive element in the form of a FET using an organic semiconductor as a channel.

A FET according to the present invention includes a gate electrode, a source electrode, a drain electrode, an electrically insulating film separating the gate electrode from the source electrode and the drain electrode, and a channel connecting the source electrode with the drain electrode. According to one form of the present invention, the channel comprises at least two different organic compounds. The channel can be a mixture of the organic compounds, or it can be a lamination of a plurality of films of different organic compounds. According to another form of the invention, the channel comprises a π-conjugated block copolymer of at least two different monomers.

Here, it is to be noted that a channel is used to indicate a portion electrically connecting the source electrode and the drain electrode.

BRIEF DESCRIPTION OF THE DRAWINGS

FIG. 1 is a schematic cross-sectional view of a first embodiment of a FET according to the present invention.

FIG. 2 is a schematic cross-sectional view of a second embodiment of a FET according to the present invention.

FIG. 3 is a schematic cross-sectional view of a third embodiment of a FET according to the present invention.

DESCRIPTION OF THE PREFERRED EMBODIMENTS

Figure 4:
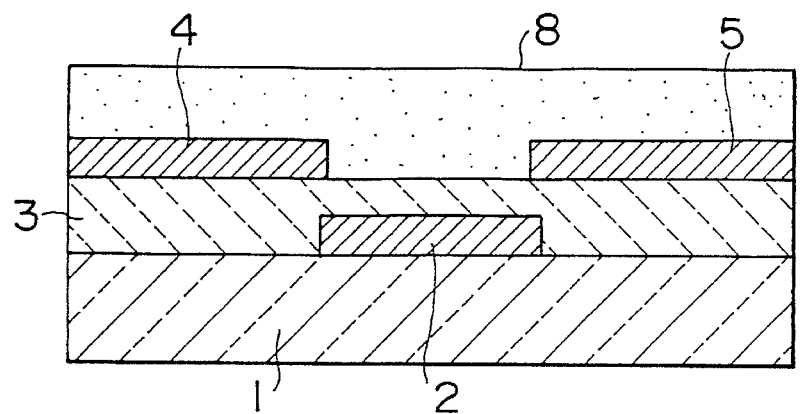
FIG. 4 is a schematic cross-sectional view of a fourth embodiment of a FET according to the present invention.

A number of preferred embodiments of a FET according to the present invention will now be described while referring to the accompanying drawings. In the following embodiments, a FET according to the present invention is an insulated-gate FET. However, the present invention is not limited to a gate-insulated FET and can be any other type, such as a junction FET.

FIG. 1 is a schematic cross-sectional view of a first embodiment. This embodiment of a FET includes a substrate 1 having a gate electrode 2 formed thereon. An electrically insulating film 3 is formed atop the substrate 1 and the gate electrode 2. A source electrode 4 and a drain electrode 5 are formed atop the insulating film 3 and are separated from one another by a film 6 which is formed atop the insulating film 3, the source electrode 4, and the drain electrode 5. This film 6, which serves as a channel for the FET, comprises a mixture of at least two different organic compounds 6a and 6b.

The substrate 1 can be formed from any electrically insulating material, some examples of which are inorganic electrical insulators such as glass and alumina sintered bodies, and electrically insulating plastics such as polyimide film, polyester film, polyphenylene sulfide film, poly-para-xylene film, and polycarbonate. Combinations of two or more of these materials can also be used.

The gate electrode 2, the source electrode 4, and the drain electrode 5 can be made of an electrically conductive material. Some examples of suitable materials are (1) metals such as gold, silver, copper, platinum, palladium, aluminum, indium, chromium, and molybdenum, (2) electrically conducting inorganic materials such as platinum silicide, palladium silicide, low-resistance polysilicon, law-resistance amorphous silicon, tin oxides, indium oxides, and indium-tin oxides (ITO), (3) electrically conducting low molecular weight organic compounds, (4) electrically conducting π-conjugated polymers, and (5) combinations of two or more of these materials.

The gate electrode 2, the source electrode 4, and the drain electrode 5 can be formed by any suitable method, such as vacuum deposition, sputtering, plating, CVD, the LB (Langmuir-Blodgett) method, Spin coating, and electrochemical polymerization, depending on the materials used for these members.

It is possible to use a single plate of p-type or n-type silicon as both the substrate i and the gate electrode 2. The volume resistivity of such a silicon plate is not restricted to any particular value, but from a practical standpoint, it is preferably smaller than that of the organic compounds 6a and 6b in film 6. Depending on the use of the FET, it is also possible for the substrate i and the gate electrode 2 to be both made of a plate or film of an electrically conducting material such as stainless steel, copper, or an electrically conducting polymer.

The insulating film 3 serves to electrically insulate the gate electrode 2 from the source electrode 4 and the drain electrode 5. It can be made of any electrically insulating material, whether organic or inorganic. Some examples of suitable materials are (1) inorganic thin films of silicon dioxide ($SiO_2$), silicon nitride ($Si_3N_4$), or aluminum oxide ($Al_2O_3$), (2) organic thin films of polyethylene, polyester, polyimide, polyphenylene sulfide, poly-para-xylene, poiyacrylonitrile, or π-conjugated polymers which have been adequately undoped, (3) various low molecular weight compounds, (4) electrically insulating LB polymer films, and (5) a combination of two or more of these materials.

The insulating film 3 can be manufactured by any suitable method, such as vacuum deposition, sputtering, CVD, plasma polymerization, spin coating, dipping, and the LB method. When a p-type or n-type silicon plate serves as both the substrate 1 and the gate electrode 2, a silicon oxide film formed by thermal oxidation of silicon is ideal as the insulating film 3.

Organic compound 6a of film 6 can be any organic compound having semiconductor properties, such as a π-conjugated polymer or low molecular weight organic semiconductors such as porphyrins, metal porphyrins, phthalocyanines, metal phthalocyanines, and merocyanines. Combinations of two or more such materials can also be used.

Organic compound 6b can be any material which has electrical conductivity falling in the range of that of a metal to that of a semiconductor. In many cases, π-conjugated polymers and low molecular weight organic semiconductors such as porphyrins, metal porphyrins, phthalocyanines, metal phthalocyanines, and merocyanines are suitable. Charge transfer complexes of low molecular weight compounds and polymers such as tetrathiafulvalene (TTF)-tetracyanoquinodimethane (TCNQ) can be used. A combination of two or more such organic compounds can also be used. Furthermore, organic compounds like those described above can also be mixed with an electrically insulating material in a prescribed ratio.

In order to improve the properties of the FET of the present invention, organic compounds 6a and/or 6b may be subjected to doping. Any suitable doping method can be employed, such as chemical doping from a gas or liquid phase, electrochemical doping, or physical doping by ion implantation.

From the standpoint of the properties of the FET element of the present inventions it is particularly desirable that, of organic compounds 6a and 6b, at least organic compound 6a be a π-conjugated polymer. Examples of suitable π-conjugated polymers are polypyrrole, poly(N-substituted pyrrole), poly(3-substituted pyrrole), poly(3,4-bisubstituted pyrrole), polythiophene, poly(3-substituted thiophene), poly(3,4-bisubstituted thiophene), polybenzothiophene, polyisothianaphthene, poly(2,5-thienylenevinylene), polyaniline, poly(N-substituted aniline), poly(2-substituted aniline), poly(3-substituted aniline), poly(2,3-bisubstituted aniline), polydiacetylenes, polyazulene, polypyrene, polycarbazole, poly(N-substituted carbazole), polyselenophene, polyfuran, polybenzofuran, polyphenylene, poly(phenylene vinylene), polyindole, polypyridazine, polyacene, copolymers of two or more such substances, or amphiphilic derivatives thereof.

There are many cases in which the properties of the FET element of the present invention are improved if the electrical conductivity of organic compound 6b is made higher than that of organic compound 6a. For example, organic compound 6a can be an undoped or lightly doped π-conjugated polymer or low molecular weight organic semiconductor, while organic compound 6b can be a different, more heavily doped π-conjugated polymer or low molecular weight organic semiconductors, or a charge transfer complex having a higher electrical conductivity than organic compound 6a. Furthermore, in light of the properties of the FET element, the ionization potential of organic compound 6a is preferably higher than that of organic compound 6b.

Film 6 comprising organic compounds 6a and 6b can be manufactured by any suitable method. Examples of suitable methods are the LB method, molecular beam epitaxial growth, vacuum deposition, sputtering, CVD, plasma polymerization, electrochemical polymerization, chemical polymerization, spin coating, casting, and dipping. The uniformity of film 6, i.e., the dispersion of organic compounds 6a and 6b is particularly good when film 6 is formed by the LB method, molecular beam epitaxial growth, or vacuum deposition. There is no particular restriction on the thickness of film 6, but from the standpoint of the properties of the FET, it is preferably at most 10 micrometers.

Compared with a conventional FET in which the region between the Source electrode and drain electrode comprises only a single organic compound, a FET according to the present invention has a lower source-drain current when it is off (a lower leak current) and a higher source-drain current when it is on. Thus, the source-drain current can be greatly modulated by the application of a voltage to the gate electrode. Moreover, a larger source-drain current is obtained, so the properties of a FET of the present invention are greatly superior to those of a conventional FET using an inorganic semiconductor. The reasons for this improvement will be discussed below.

In a conventional organic FET in which the film between the source electrode and the drain electrode comprises only a single organic compound, the organic compound has to function both as a place in which carriers can travel and as a place for supplying carriers. In order to make it possible for the film to supply a large amount of carriers, methods such as doping of the organic compound are performed. However, if the organic compound is excessively doped in order to enable it to supply carriers, the organic compound ends up resembling a metal. Therefore, even though a large source-drain current can be obtained, it becomes impossible to greatly modulate the source-drain current by the gate voltage (see Synthetic Metals, Vol. 25, pp. 11–23 (1988)). Thus, in a conventional organic FET employing only a single organic compound in the film between the source electrode and drain electrode, it is not possible to obtain both a large ON/OFF ratio and a large source-drain current.

In contrast, a FET element according to the present invention has a film forming a channel between the source electrode and drain electrode comprising two organic compounds. Carriers can travel in one of the compounds (organic compound 6a in the embodiment of FIG. 1), while the other organic compound (organic compound 6b) can supply carriers.

For example, if organic compound 6a is an undoped or lightly doped π-conjugated polymer or a low-molecular weight organic semiconductor, the number of carriers in organic compound 6a will be small, so when no gate voltage is applied, the source-drain current will be small, even if a source-drain voltage is applied. At the same time, if organic compound 6b is a more heavily doped π-conjugated polymer or low molecular weight organic semiconductor, or a charge transfer complex having a higher electrical conductivity than organic compound 6a, when a gate voltage is applied, since organic compound 6b is more heavily doped than organic compound 6a, organic compound 6b will supply carriers to organic compound 6a and a large source-drain current will flow. Thus, the source-drain current can be greatly modulated by the application of a gate voltage, and a large source-drain current can be obtained.

In general, organic compound 6b is made unable to serve by itself as a path for connecting the source electrode and the drain electrode. There is no restriction on the size of the particles of organic compound 6b in film 6.

Although not shown in the figures, it is possible to form a protective film of an organic or inorganic electrically insulating material atop film 6 in order to protect the entire FET.

In the embodiment of FIG. 1, the film 6 forming a channel between the source electrode 4 and the drain electrode 5 is a mixture of at least two, organic compounds. However, instead of being a mixture, it is possible for it to be a lamination of a plurality of thin films of at least two different organic compounds. FIG. 2 is an embodiment of an FET according to the present invention in which the region defining a channel between a source electrode 4 and a drain electrode 5 is a laminated film 7 comprising a first organic thin film 7a and a second organic thin film 7b formed atop the source electrode 4 and the drain electrode 5. Like the embodiment of FIG. 1, it includes a substrate 1, a gate electrode 2 formed atop the substrate 1, and an insulating film formed atop the substrate 1 and the gate electrode 2 beneath the source electrode 4 and the drain electrode 5. Elements 1–5 of FIG. 2 can be manufactured using the same materials and methods as described above with respect to elements 1–5 of FIG. 1. Thin film 7a can be made of any of the materials which can be used for organic compound 6a of FIG. 1, and thin film 7b can be made of any of the materials which can be used for organic compound 6b. Thin film 7b will generally have a higher electrical conductivity than thin film 7a. Furthermore, thin film 7a preferably has a higher ionization potential than thin film 7b. There is no particular restriction on the thickness of laminated film 7, but from the standpoint of the properties of the FET, it is preferably at most 10 micrometers. The thin films 7a and 7b can be manufactured by any suitable methods, such as the LB method, molecular beam epitaxial growth, vacuum deposition, sputtering, CVD, plasma polymerization, electrochemical polymerization, chemical polymerization, spin coating, casting, and dipping.

When thin film 7b has a higher electrical conductivity than thin film 7a, thin film 7a functions as a layer in which carriers travel, and thin film 7b functions as a layer for supplying carriers. For example, if thin film 7a is an undoped or lightly doped π-conjugated polymer or a low-molecular weight organic semiconductor, the number of carriers in thin film 7a will be small, so when no voltage is applied to the gate electrode 2, the source-drain current will be small, even if a source-drain voltage is applied. At the same time, if thin film 7b is a more heavily doped π-conjugated polymer or low molecular weight organic semiconductors on a charge transfer complex having a higher electrical conductivity than thin film 7a, when a voltage is applied to the gate electrode 2, since thin film 7b is more heavily doped than thin film 7a, thin film 7b will supply carriers to thin film 7a and a large source-drain current will flow. Thus, the source-drain current can be greatly modulated by the application of a gate voltage, and a large source-drain current can be obtained.

The case was explained above in which organic thin film 7b is an organic compound having a higher electrical conductivity than organic thin film 7a. However, is it also possible for organic thin film 7b to be a mixture of an electrically insulating organic compound and an electron acceptor or electron donor such as iodine, tetrathiafulvalene, or tetracyanoquinodimethane which can supply carriers to organic thin film 7a. Due to the same mechanism as described above, an FET having satisfactory characteristics can be obtained.

A laminated film 7 forming a channel between the source electrode 4 and the drain electrode 5 of an FET according to the present invention is not limited to only two organic thin films. FIG. 3 illustrates another embodiment of the present invention in which a laminated film 7 comprises three organic thin films 7a–7c. Thin films 7a and 7b can be made of any of the same materials used for thin films 7a and 7b, respectively, of the embodiment of FIG. 2. Thin film 7c, which is disposed between thin films 7a and 7b, can be made of any organic substance having the property of passing carriers but not ions or dopants. Some examples of suitable materials are polymers such as polyethylene, polyesters, polyimide, polyphenylenesulfide, poly-para-xylene, and polyacrylonitrile, various low molecular weight organic compounds, and various LB films. In some cases, it is also possible to use a π-conjugated polymer which has been adequately undoped. A combination of two or more such materials can also be used. There is no restriction on the thickness of thin film 7c, but from the standpoint of the operating characteristics of the FET, a thickness of at most 5000 Å is preferable. Thin films 7a–7c can be manufactured using the same methods as for thin films 7a and 7b of FIG. 2.

When organic thin film 7a is in direct contact with organic thin film 7b, as in the embodiment of FIG. 2, ions, dopants, and the like in organic thin film 7b can easily diffuse into organic thin film 7a. With the passage of time, the ions and dopants which diffuse from organic thin film 7b into organic thin film 7a act as traps for carriers in thin film 7a, impede the movement of carriers, and cause a deterioration in the properties of the FET. However, if a thin film 7c which passes carriers but almost no ions or dopants is disposed between thin films 7a and 7b, the diffusion of ions and dopants from thin film 7b into thin film 7a can be prevented, and the performance of the FET can be maintained at a high level.

The laminated film 7 is not limited to three films, and additional thin films can be formed atop those illustrated in the figures. In addition, an organic or inorganic electrically insulating protective film can be formed atop the laminated film 7.

FIG. 4 illustrates another embodiment of an FET according to the present invention. Like the preceding embodiments, it includes a substrate 1, a gate electrode 2 formed atop the substrate 1, an insulating film 3 formed atop the substrate 1 and the gate electrode 2, and a source electrode 4 and a drain electrode 5 formed atop the insulating film 3. A film 8 which serves as a channel is formed atop the source electrode 4, the drain electrode 5, and the insulating film 3. The film 8 comprises a π-conjugated block copolymer of at least two types of monomers.

Element numbers 1–5 of this embodiment can be formed using the same materials and methods as for element numbers 1–5 of the embodiment of FIG. 1. One example of a π-conjugated block copolymer for use in film 8 is expressed by the general formula

  (1)

wherein A and B are different monomers and m and n are integers greater than or equal to 2.

There are many cases when at least one of the blocks —(A)$_m$— and —(B)$_n$— is doped. The ionization potential of each block is different, so from the standpoint of the characteristics of the resulting FET, doping is preferably carried out on the block having the smaller ionization potential. When carriers are already present in at least the block having the smaller ionization potential, there are cases in which it is not necessary to perform doping of either block.

The π-conjugated block copolymer used for film 8 can be formed of three different types of monomers as expressed by the general formula

  (2)

wherein A, B, and C are different monomers and l, m, and n are integers greater than or equal to 2. If doping is performed on such a block copolymer, the doping is started with the block having the smallest ionization potential. However, as stated above, if carriers are already present, it may not be necessary to perform doping.

The π-conjugated block copolymer can also be one comprising four or more different monomers.

Some examples of the blocks ((A)$_l$-(B)$_m$, (C)$_n$, etc.) forming the π-conjugated block copolymer are polyacetylene, polydiacetylene, polypyrrole, polythiophene, polyselenophene, polyisothianaphthene, poly(arylene vinylene), polyaniline, polyazulene, polypyrene, polycarbazole, polyfuran, polyphenylene, polyindole, polypyridazine, and polyacene, any of which can be used. Monomers which are derivatives of such materials can also be used.

There is no particular restriction on the method of forming the π-conjugated block. Copolymer used as film 8. Examples of suitable methods are the living polymerization method in which monomers are successivly polymerized with a polymer, a method in which monomers having active groups at their ends are first synthesized and then are polymerized with one another at their ends, or a method in which different types of monomers having active groups on their ends are connected to each other.

Examples of methods which can be used to form the film 8 of a π-conjugated block copolymer are CVD, plasma CVD, plasma polymerization, vacuum deposition, cluster ion beam vacuum deposition, organic molecular beam epitaxial growth, spin coating, dipping, and the LB method.

An example will now be described of a manufacturing method for a π-conjugated block copolymer comprising two types of five-member heterocyclic rings and having the following general formula:

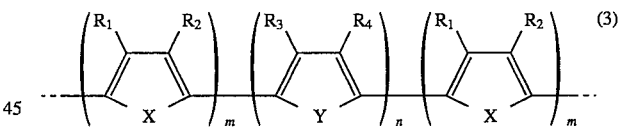  (3)

The case will be described in which the active groups on the end of two different polymers are joined by chemical polymerization. In formula (3), $R_1$, $R_2$, $R_3$, and $R_4$ are each selected from —H, an alkyl group, and an alkoxy group. X and Y are each selected from NR$_5$, O, S, Se, and Te. m and n are integers greater than or equal to 2. R$_5$ is selected from —H, an alkyl group, an alkoxy group, a phenyl group, and a substituted phenyl group.

As shown by the following formula, in tetrahydrofuran or other ether-type solvent monomers in the form of heterocyclic five-member rings with a halogen attached in the 2 and 5 positions react with magnesium.

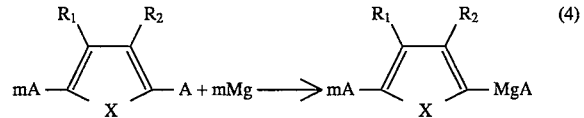  (4)

In formula (4), $R_1$, $R_2$, X, and m have the same meanings as in formula (3), while A represents a halogen.

Next, as shown by the following formula

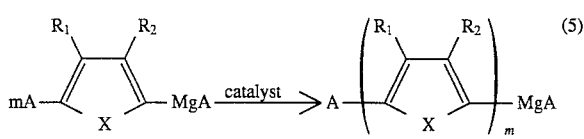

(5)

a halogenated nickel such as $NiCl_2$ or $NiBr_2$ or a nickel complex such as dichloro(2,2'-bipyridine) nickel, dibromobis(triphenylphosphine) nickel, 1,5-cylcooctadiene-bis-(triphenylphosphine) nickel, or dichloro(diphenylphosphinoethane) nickel is used as a catalyst and dehalogenation condensation is performed to obtain a monomer.

Two types of polymers obtained by the reaction of formula (5) are mixed, and dehalogenation condensation using a catalyst is carried out as expressed by the following formula

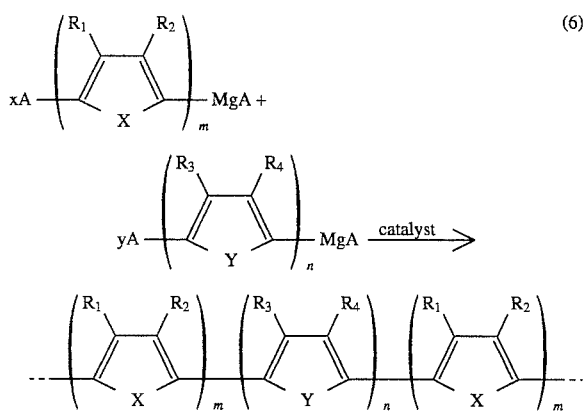

(6)

to obtain a π-conjugated block copolymer represented by formula (3). Here, x and y are integers.

The same catalyst can be employed in the reactions of formulas (5) and (6). Chemical manufacturing methods for homopolymers are described in detail in Synthetic Metals, Vol. 9, pp. 77–86 (1984) and in Bulletin of the Chemical Society of Japan, Vol. 56, pp. 1497–1502. The chemical polymerization method described in these articles can be used for the synthesis of the π-conjugated block copolymer. When this chemical polymerization method is used, particularly in the case of the π-conjugated block copolymer of formula (3), if the side chain is a long-chain alkyl group, alkoxy group, or the like which is soluble in many organic solvents, a film of the π-conjugated block copolymer can be formed by simple methods such as spin coating, casting, dipping, bar coating, and roll coating, resulting in a simplification of the manufacturing process for the FET.

There are cases in which carriers are present in a π-conjugated block copolymer even if doping is not carried out. Such π-conjugated block copolymers may exhibit the properties of semiconductors, even through they have a low electrical conductivity. As stated earlier, doping is frequently carried out to improve the properties of a FET element. Doping methods can be classified as chemical methods and physical methods (see Kogyo Zairyo (Industrial Materials), Vol. 34, No. 4, p. 55 (1986)). Chemical methods include (i) doping from a gaseous phase, (ii) doping from a liquid phase, (iii) electrochemical doping, and (iv) photo-initiated doping. Physical doping comprises ion implantation. Any of these methods can be employed.

From the standpoint of the properties of the FET, doping is preferably carried out only on the portion of the π-conjugated block copolymer having the lower ionization potential. For example, in formula (3), when block $—(A)_m—$ has a lower ionization potential than block $—(B)_n—$, p-type doping is selectively carried out on the former.

There are many aspects of the mechanism of operation of an FET according to the present invention which are still unclear. However, it is thought that the width of the depletion layer formed in film 8 at the interface of film 8 and the insulating film 3 is controlled by the voltage applied between the gate electrode 2 and the source electrode 4. As a result, the effective cross-sectional area of a channel for carriers between the source electrode 4 and the drain electrode 5 is varied, and the source-drain current is changed.

When p-type doping is selectively carried out on the portion of the π-conjugated block copolymer having the lower ionization potential, carriers accumulate in this portion. When a voltage is applied between the gate electrode 2 and the source electrode 4, the number of carrier supplied from the portion having the lower ionization potential to the entire channel of the FET changes, and the magnitude of the current change in the channel increases.

Figure 5A:
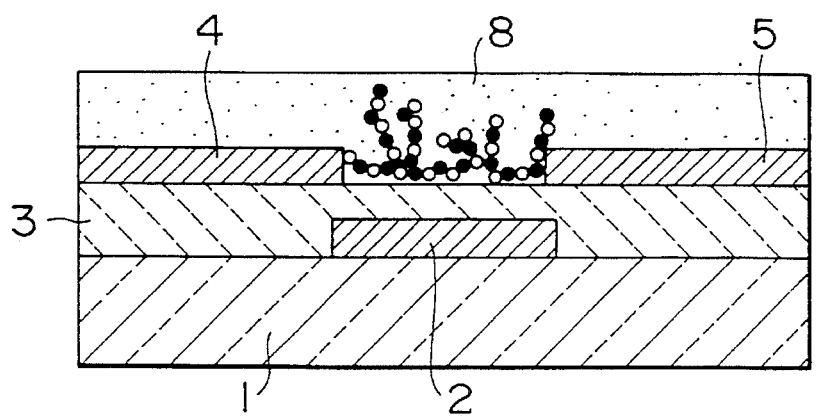
FIGS. 5A and 5B are schematic cross-sectional views of the embodiment of FIG. 4 showing the movement of carriers when a gate voltage is applied to the FET.
Figure 5B:
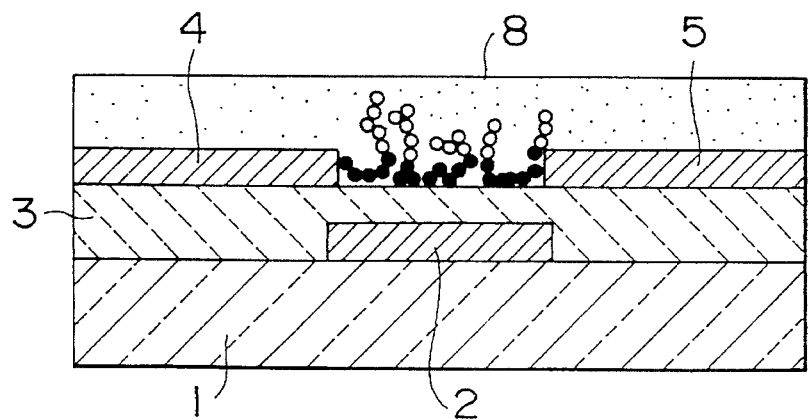

The principles of operation of an FET according to the present invention will be described in greater detail with reference to FIGS. 5A and 5B, which schematically illustrate the π-conjugated block copolymers in film 8. In the figure, the alternating open and solid circles shows a π-conjugated block copolymer. The stuctural units of the π-conjugated block copolymer having a higher ionization potential are difficult to dope, while the structural units having the lower ionization potential are easily doped. Therefore, the open circles indicate undoped portions; and the solid circles indicate doped portions.

Carriers are locally present in the doped portions. When the gate voltage $V_o=0$ volts, doped and undoped portions are present over the entirety of film 8, so the current flowing between the source electrode 4 and the drain electrode 5 is small. However, when the gate voltage $V_o<0$ volts, a negative potential is applied to the interface of film 8 and the insulating film 3, so as shown in FIG. 5B, the carriers which are present locally in the doped portions collect at the interface. As the carriers accumulate at the interface, the entire channel at the interface becomes p-type doped, and the source-drain current greatly increases.

Thus, by using a π-conjugated block copolymer as a film 8 defining a channel between the source electrode 4 and the drain electrode 5, a large source-drain current can be obtained when a gate voltage is applied without increasing the leak current between the source electrode 4 and the drain electrode 5.

Figure 6:
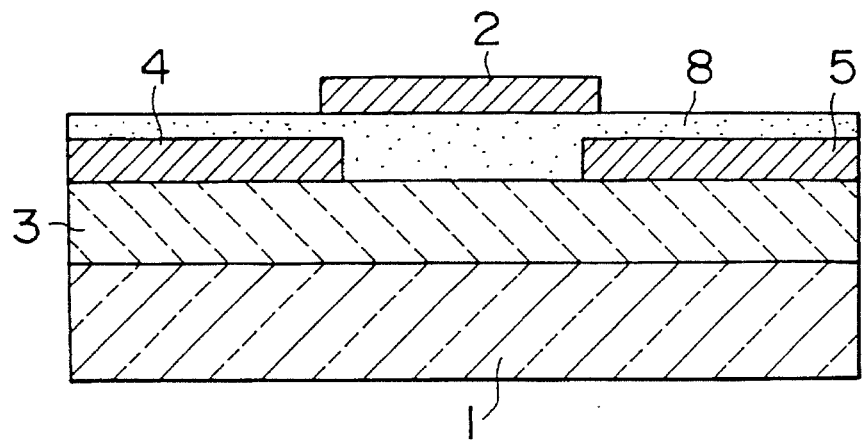
FIG. 6 is a schematic cross-sectional view of a fifth embodiment of a FET according to the present invention.

The structure of a FET according to the present invention is not limited to that illustrated in FIG. 4. FIG. 6 is a schematic cross-sectional view of another embodiment of the present invention in which a gate electrode 2 is formed atop a film 8 of a π-conjugated block copolymer instead of atop a substrate 1. The structure of this embodiment is otherwise the same as that of the embodiment of FIG. 4, and same materials and manufacturing methods can be used as in that embodiment. Because of the use of a π-conjugated block copolymer for a film 8 forming a channel between the source electrode 4 and the drain electrode 5, the FET has a low leak current when the FET is off and a high source-drain current when a gate voltage is applied.

Other arrangements of the components of an FET according to the present invention are also possible. For example, with reference to FIG. 4, film 8 of a π-conjugated block copolymer could be formed atop the insulating film 3, and the source electrode 4 and the drain electrode 5 could be formed atop film 8 rather than beneath it.

As another example, the source electrode 4 and the drain electrode 5 could be formed atop the substrate 1. Film 8 of a π-conjugated block copolymer could be formed atop the source electrode 4, the drain electrode 5, and the substrate 1, an insulating film 3 could be formed atop film 8, and a gate electrode 2 could then be formed atop the insulating film 3.

As mentioned previously, it is possible to use a plate of p-type or n-type silicon as both the substrate 1 and the gate electrode 2, in which case the substrate 1 can be omitted. The volume resistivity of the silicon plate is preferably lower than that of the π-conjugated block copolymer used as film 8. When the substrate 1 and the gate electrode 2 are formed from silicon, it is possible to use a silicon oxide film formed by heat oxidation of the silicon as the insulating film 3.

Figure 7:
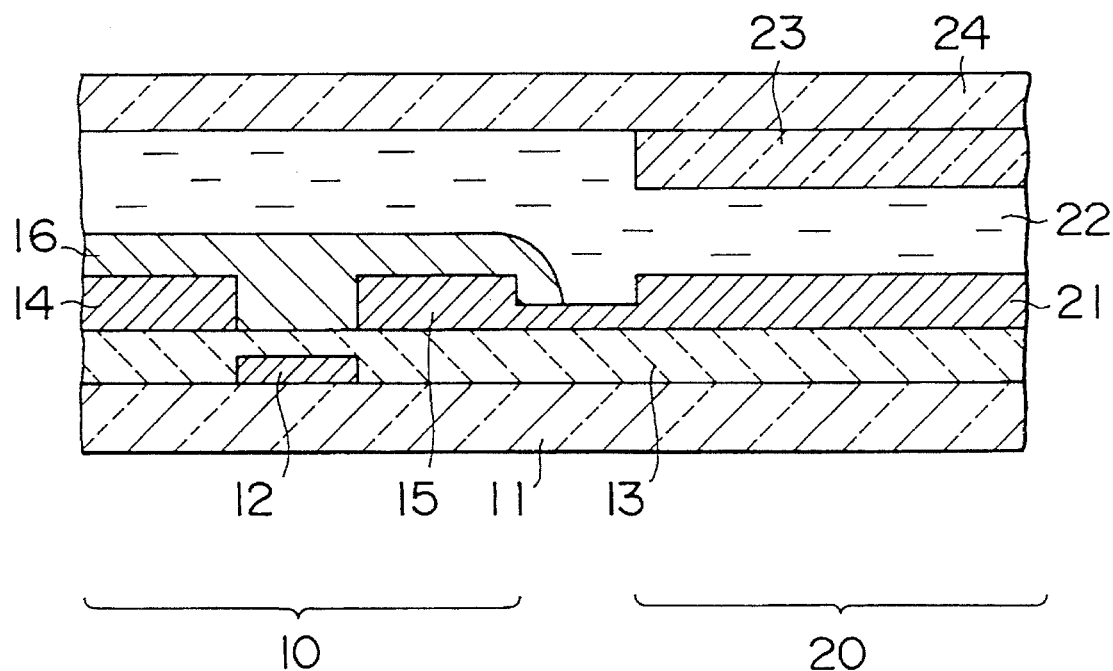
FIG. 7 is a schematic cross-sectional view of an embodiment of a liquid crystal display according to the present invention.

A FET according to the present invention is particularly suitable as an active drive element for a liquid crystal display. FIG. 7 is a schematic cross-sectional view of an embodiment of a liquid crystal display according to the present invention. It includes a FET portion 10 connected in series with a liquid crystal portion 20. The FET portion 10 has the same structure as the embodiment of FIGS. 1, 2, 3 and 4, although it could be the same as any of the other above-described embodiments of a FET of the present invention. It includes a substrate 11, a gate electrode 12 formed atop the substrate 11, an insulating film 13 formed atop the substrate 11 and the gate electrode 12, a source electrode 14 and a drain electrode 15 formed apart from one another atop the insulating film 15, and a film 16 of a π-conjugated polymer(s) formed between the source electrode 14 and the drain electrode 15 and functioning as a channel. The substrate 11, the gate electrode 12, the insulating film 13, the source electrode 14, the drain electrode 15, and film 16 can be made of the same materials as are the corresponding elements of the preceding embodiments of a FET.

The liquid crystal portion 20 includes an electrode 21 formed atop the insulating film 13 and connected to the drain electrode 15 of the FET portion 10. A liquid crystal layer 22 is formed atop film 15 and electrode 21. A transparent electrode 23 is formed atop the liquid crystal layer 22, and a glass plate 24 equipped with an unillustrated polarizing plate is disposed atop the liquid crystal layer 22 and the transparent electrode 23.

Electrode 21, which is shorted to drain electrode 15, can be any substance which have good electrical conductivity and which is insoluble in the liquid crystal layer 22. Examples of suitable materials are metals such as gold, platinum, chromium, or aluminum, transparent electrodes such as tin oxide, indium oxide, and indium-tin oxide, or electrically conducting organic polymers. A combination of two or more such materials can also be used.

The transparent electrode 23 is usually a transparent electrically conducting material such as tin oxide, indium oxide, or indium-tin oxide (ITO). It is also possible to use an electrically conducting organic polymer having a suitable degree of transparency. Two or more such materials may also be used in combination. It is necessary to perform orientation treatment, such as oblique vacuum deposition of $SiO_2$, rubbing, or the like on electrodes 21 and 23.

The liquid crystal layer 22 can comprise a guest-host type liquid crystal, a TN-type liquid crystal, a smectic-C phase liquid crystal, or the like.

When glass is used as substrate 11 and electrode 21 is transparent, the contrast ratio can be increased by attaching a polarizing plate to substrate 11. The polarizing plate attached to the glass plate 24 can be any polarizing material.

From FIG. 7, it can be seen that the FET portion 10 and the liquid crystal portion 20 are connected in series. When film 16 of a π-conjugated block copolymer has the properties of a p-type semiconductor, if the source electrode 14 is used as a reference, a negative voltage is applied to the transparent electrode 23, and a negative voltage is applied to the gate electrode 12, then the liquid crystal layer 22 is activated. As stated above with respect to the preceding embodiments, this is thought to be because the resistance between the source electrode 14 and the drain electrode 15 decreases as the gate voltage becomes more negative, and a voltage is applied to the liquid crystal portion 20. On the other hand, if the source electrode 14 is used as a reference, a negative voltage is applied to transparent electrode 23, and the gate voltage is cut off, the liquid crystal 22 stops being activated. This is because decreasing the gate voltage from a negative value causes the resistance between the source electrode 14 and the drain electrode 15 to increase, so no voltage is applied to the liquid crystal portion 20. Thus, by varying the gate voltage of the FET portion 10, the liquid crystal portion 20 can be controllably driven.

Since a liquid crystal display according to the present invention is equipped with a FET employing an organic semiconductor, the liquid crystal display can be inexpensively manufactured using simple manufacturing processes.

What is claimed is:

1. A field effect transistor comprising:

a gate electrode;

a source electrode;

a drain electrode; and a channel electrically connecting the source electrode and the drain electrode and comprising a mixture of a first organic compound and a second organic compound, said first organic compound and said second organic compound being two different organic compounds, said first organic compound having semiconductor properties, said second organic compound having an electrical conductivity greater than or equal to that of a semiconductor, the gate electrode being electrically coupled with the channel to control the electrical conductivity of the channel, wherein said first organic compound is a π-conjugated polymer.

2. A field effect transistor as claimed in claim 1, wherein said first organic compound has an ionization potential higher than an ionization potential of said second organic compound.

3. A field effect transistor comprising:

a gate electrode;

a source electrode;

a drain electrode; and a channel electrically connecting the source electrode and the drain electrode and comprising a π-conjugated block copolymer of at least two types of monomers, the gate electrode being electrically coupled with the channel to control electrical conductivity of the channel.

4. A liquid crystal display comprising:

a field effect transistor having a gate electrode, a source electrode, a drain electrode, and a channel electrically connecting the source electrode and the drain electrode and comprising a π-conjugated block copolymer of at least two types of monomers, the gate electrode being electrically coupled with the channel to control electrical conductivity of the channel;

a pair of electrodes, wherein a first electrode of said pair is connected to one of the source electrode and the drain electrode of the field effect transistor, a liquid crystal layer is disposed on said first electrode, and a second electrode of said pair is disposed on said liquid crystal layer, such that said liquid crystal layer is disposed between said pair of electrodes.

5. A field effect transistor comprising:

a gate electrode;

a source electrode;

a drain electrode; and a channel electrically connecting the source electrode and the drain electrode and comprising a lamination of a first film of a π-conjugated polymer and a second film of an organic compound, said second film is a different organic compound than said first film, the gate electrode being electrically coupled with the channel to control electrical conductivity of the channel.

6. A field effect transistor as claimed in claim 5 wherein the first film is in direct contact with the source electrode and the drain electrode, and the second film is separated from the source electrode and the drain electrode by the first film and has a higher electrical conductivity than an electrical conductivity of the first film.

7. A field effect transistor as claimed in claim 6 wherein the first film has a higher ionization potential than an ionization potential of the second film.

8. A field effect transistor as claimed in claim 5 wherein the second film is a π-conjugated polymer.

9. A liquid crystal display comprising:

a filed effect transistor having a gate electrode, a source electrode, a drain electrode, and a channel electrically connecting the source electrode and the drain electrode and comprising a lamination of a first film of a π-conjugated polymer and a second film of an organic compound, said second film being a different organic compound than said first film, the gate electrode being electrically coupled with the channel to control electrical conductivity of the channel;

a pair of electrodes, wherein a first electrode of said pair is connected to one of the source electrode and the drain electrode of the field effect transistor, a liquid crystal layer is disposed on said first electrode, and a second electrode of said pair is disposed on said liquid crystal layer, such that said liquid crystal layer is disposed between said pair of electrodes.

10. A liquid crystal display as claimed in claim 9 wherein the first film is in direct contact with the source electrode and the drain electrode, and the second film is separated from the source electrode and the drain electrode by the first film and has a higher electrical conductivity than an electrical conductivity of the first film.

11. A liquid crystal display as claimed in claim 10 wherein the first film has a higher ionization potential than an ionization potential of the second film.

12. A field effect transistor as claimed in claim 11 wherein the second film is a π-conjugated polymer.

13. A liquid crystal display comprising:

a field effect transistor having a gate electrode, a source electrode, a drain electrode, and a channel electrically connecting the source electrode and the drain electrode and comprising a mixture of a first organic compound and a second organic compound, said first organic compound and said second organic compound being two different organic compounds, said first organic compound having semiconductor properties, said second organic compound having an electrical conductivity greater than or equal to that of a semiconductor, the gate electrode being electrically coupled with the channel to control the electrical conductivity of the channel, wherein said first organic compound is a π-conjugated polymer;

a pair of electrodes, wherein a first electrode of said pair is connected to one of the source electrode and the drain electrode of the field effect transistor, a liquid crystal layer is disposed on said first electrode, and a second electrode of said pair is disposed on said liquid crystal layer, such that said liquid crystal layer is disposed between said pair of electrodes.

14. A liquid crystal display as claimed in claim 13, wherein said first organic compound has an ionization potential higher than an ionization potential of said second organic compound.

* * * * *